United States Patent
Xia

(10) Patent No.: US 11,468,799 B2
(45) Date of Patent: Oct. 11, 2022

(54) FLEXIBLE CIRCUIT BOARD ASSEMBLY AND FLEXIBLE DISPLAY DEVICE

(71) Applicant: Wuhan China Star Optoelectronics Semiconductor Display Technology Co., Ltd., Hubei (CN)

(72) Inventor: Hao Xia, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 206 days.

(21) Appl. No.: 16/641,156

(22) PCT Filed: Jan. 8, 2020

(86) PCT No.: PCT/CN2020/070818
§ 371 (c)(1),
(2) Date: Feb. 21, 2020

(87) PCT Pub. No.: WO2021/031514
PCT Pub. Date: Feb. 25, 2021

(65) Prior Publication Data
US 2021/0407331 A1    Dec. 30, 2021

(30) Foreign Application Priority Data
Aug. 21, 2019  (CN) .......................... 201910773702.6

(51) Int. Cl.
*G09F 9/30*       (2006.01)
*G06F 3/041*      (2006.01)
(Continued)

(52) U.S. Cl.
CPC ............ *G09F 9/301* (2013.01); *G06F 3/0412* (2013.01); *H05K 1/028* (2013.01); *H05K 1/142* (2013.01)

(58) Field of Classification Search
CPC .... H05K 1/028; H05K 1/0277; H05K 1/0281; H05K 1/14; H05K 1/141; H05K 1/142;
(Continued)

(56) References Cited

U.S. PATENT DOCUMENTS

2006/0221269 A1   10/2006  Kawaguchi
2007/0141864 A1*   6/2007  Kataoka ................. H05K 1/028
                                                                439/67
(Continued)

FOREIGN PATENT DOCUMENTS

CN       102098867 A       6/2011
CN       102752954 A      10/2012
(Continued)

OTHER PUBLICATIONS

CN 208190993 U Translation (Year: 2022).*

*Primary Examiner* — Hoa C Nguyen
*Assistant Examiner* — John B Freal
(74) *Attorney, Agent, or Firm* — Taft Stettinius & Hollister LLP

(57) ABSTRACT

A flexible circuit board assembly and a flexible display device include a first flexible circuit board, a T-shaped flexible circuit board, and a second flexible circuit board. The first flexible circuit board and the second flexible circuit board are located on a top of the T-shaped flexible circuit board and are coplanar with the T-shaped flexible circuit board. Two ends of a top of the T-shaped flexible circuit board are connected respectively to the first flexible circuit board and the second flexible circuit board perpendicularly.

1 Claim, 3 Drawing Sheets

(51) Int. Cl.
*H05K 1/02* (2006.01)
*H05K 1/14* (2006.01)

(58) Field of Classification Search
CPC .... H05K 1/147; H05K 1/0393; G06F 3/0412; G09F 9/301
See application file for complete search history.

(56) References Cited

U.S. PATENT DOCUMENTS

| | | | |
|---|---|---|---|
| 2008/0158181 A1* | 7/2008 | Hamblin | G06F 3/04164 345/173 |
| 2009/0283300 A1* | 11/2009 | Grunthaner | H05K 1/118 174/254 |
| 2011/0132642 A1 | 6/2011 | Shinoda et al. | |
| 2012/0268904 A1 | 10/2012 | Chien et al. | |
| 2013/0215577 A1* | 8/2013 | Huang | H05K 3/361 29/830 |
| 2016/0103540 A1 | 4/2016 | Huang | |
| 2019/0159342 A1 | 5/2019 | Oh | |
| 2020/0053874 A1 | 2/2020 | Eom et al. | |
| 2020/0076097 A1 | 3/2020 | Xu et al. | |

FOREIGN PATENT DOCUMENTS

| | | | |
|---|---|---|---|
| CN | 104050884 A | | 9/2014 |
| CN | 108877528 A | | 11/2018 |
| CN | 208190993 U | * | 12/2018 |
| CN | 208940272 U | | 6/2019 |
| KR | 100815675 B1 | | 3/2008 |

* cited by examiner

FLEXIBLE CIRCUIT BOARD ASSEMBLY AND FLEXIBLE DISPLAY DEVICE

CROSS REFERENCE TO RELATED APPLICATIONS

This application claims priority to, and the benefit of, International Application No. PCT/CN2020/070818, filed on Jan. 8, 2020, which claims priority to, and the benefit of, Chinese Application No. 201910773702.6, filed on Aug. 21, 2019. The entire disclosures of each of the above applications are incorporated herein by reference.

FIELD OF INVENTION

The present invention relates to a field of display technologies, especially relates to a flexible circuit board assembly and a flexible display device.

BACKGROUND OF INVENTION

With the development of display technology, current electronic devices such as mobile phones, tablet computers, etc. all require their screens to have touch functions. A plug-in touch panel (TP), attached to a display panel, is a more common way to implement touch panels. For a display panel manufacturer. The greatest difficulty of a current flexible display device is how to minimize the size of its borders. In the current solutions of the plug-in touch panel, a folding extent of flexible circuit board extremely restrict a lower border of a flexible display device because it is required to leave a gap between a folding angle of the designed flexible circuit board and a folding angle of the display panel to prevent damage to a structure of a folding region of the display panel during folding of the flexible circuit board resulting in abnormal displayed image.

As described above, the conventional flexible circuit board assembly and flexible display device probably damage the structure of the folding region of the display panel during folding of the flexible circuit board to further cause abnormal displayed images of the flexible display device.

SUMMARY OF INVENTION

Technical Issue

The conventional flexible circuit board assembly and flexible display device probably damage the structure of the folding region of the display panel during folding of the flexible circuit board to further cause abnormal displayed images of the flexible display device.

Technical Solution

In a first aspect, the present invention embodiment provides a flexible circuit board assembly, comprising a first flexible circuit board, a T-shaped flexible circuit board, and a second flexible circuit board, wherein the first flexible circuit board and the second flexible circuit board are located on a top of the T-shaped flexible circuit board and are coplanar with the T-shaped flexible circuit board, two ends of the top of the T-shaped flexible circuit board are connected respectively to the first flexible circuit board and the second flexible circuit board perpendicularly.

In the flexible circuit board assembly, the first flexible circuit board, the T-shaped flexible circuit board and the second flexible circuit board are an integral structure.

In the flexible circuit board assembly, the T-shaped flexible circuit board comprises a first rectangular portion and a second rectangular portion, an end of the first rectangular portion is located under a geometric center of the second rectangular portion and is connected to the second rectangular portion.

In the flexible circuit board assembly, the first flexible circuit board and the second flexible circuit board are rectangular board-shaped, and are parallel to each other or coaxial, and the first flexible circuit board and the second flexible circuit board are connected respectively to two ends of the second rectangular portion perpendicularly.

In a second aspect, the present invention embodiment also provides a flexible display device, comprising a display panel, a touch panel, and a flexible circuit board assembly; the flexible circuit board assembly comprising a first flexible circuit board, a T-shaped flexible circuit board, and a second flexible circuit board, wherein the first flexible circuit board, the T-shaped flexible circuit board, and the second flexible circuit board are formed integrally, an end of a bottom of the T-shaped flexible circuit board is disposed securely on the display panel, two ends of a top of the T-shaped flexible circuit board are connected respectively to the first flexible circuit board and the second flexible circuit board perpendicularly, and the first flexible circuit board and the second flexible circuit board are located respectively on two sides of the display panel and are disposed securely on the touch panel.

In the flexible display device, the display panel comprises an effective displaying region, a folding region, and a bonding region, the folding region is located between the effective displaying region and the bonding region.

In the flexible display device, the touch panel is located in the bonding region.

In the flexible display device, the first flexible circuit board and the second flexible circuit board are located respectively on two sides of the folding region and are at intervals with the two sides of the folding region.

In the flexible display device, when the flexible display device is folded, a folding angle of the flexible circuit board assembly is less than a folding angle of a portion of the display panel located in the folding region.

In the flexible display device, the flexible circuit board assembly is disposed securely on the display panel and the touch panel by a conductive adhesive film.

DETAILED DESCRIPTION OF PREFERRED EMBODIMENTS

Figure 1:
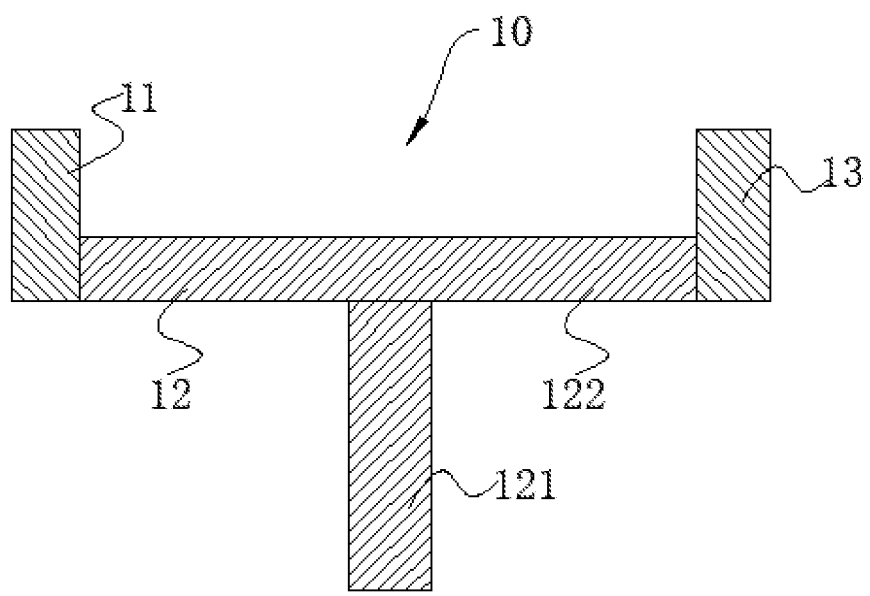
FIG. 1 is a schematic structural view of a preferred embodiment of a flexible circuit board assembly of the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The present invention aims at the technical issue that the conventional flexible circuit board assembly and flexible display device probably damage the structure of the folding region of the display panel during folding of the flexible circuit board to further cause abnormal displayed images of the flexible display device. The present embodiment can solve the defect.

With reference to FIG. 1, FIG. 1 is a schematic structural view of a preferred embodiment of a flexible circuit board assembly of the present invention. The flexible circuit board assembly 10 of the present preferred embodiment comprises a first flexible circuit board 11, a T-shaped flexible circuit board 12, and a second flexible circuit board 13. The first flexible circuit board 11 and the second flexible circuit board 13 are located on a top of the T-shaped flexible circuit board 12 are coplanar with the T-shaped flexible circuit board 12. Two ends of the top of the T-shaped flexible circuit board 12 are connected respectively to the first flexible circuit board 11 and the second flexible circuit board 13 perpendicularly.

Specifically, the first flexible circuit board 11, the T-shaped flexible circuit board 12 and the second flexible circuit board 13 are an integral structure.

Specifically, the T-shaped flexible circuit board 12 comprises a first rectangular portion 121 and a second rectangular portion 122. An end of the first rectangular portion 121 is located under a geometric center of the second rectangular portion 122 and is connected to the second rectangular portion 122.

Specifically, both the first flexible circuit board 11 and the second flexible circuit board 13 are rectangular board-shaped, and are parallel to each other or coaxial. The first flexible circuit board 11 and the second flexible circuit board 13 are connected respectively to two ends of the second rectangular portion 122 perpendicularly.

Figure 2:
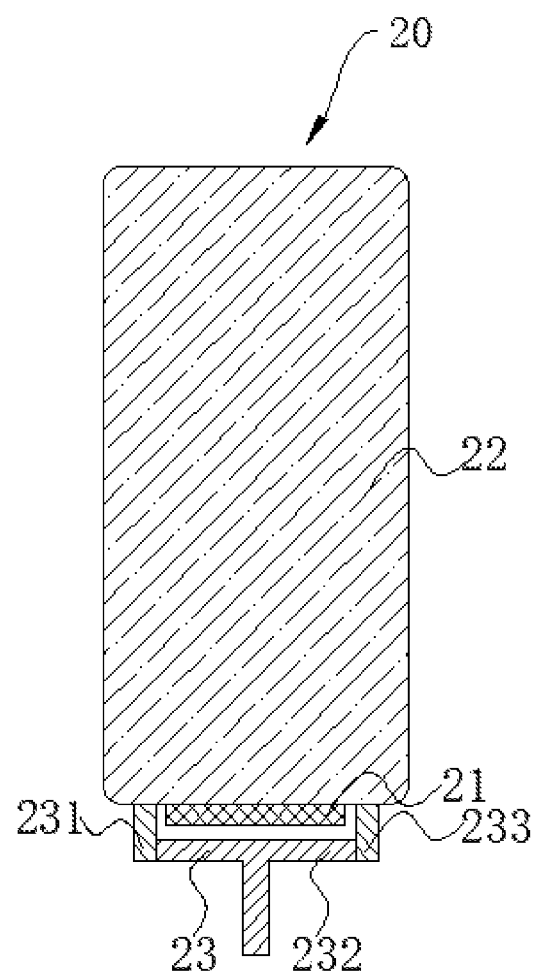
FIG. 2 is a schematic planar view of structures of the flexible display device of the present invention before folding.

With reference to 2, FIG. 2 is a schematic planar view of structures of the flexible display device of the present invention before folding. The flexible display device 20 of the present invention comprises a display panel 21, a touch panel 22, and a flexible circuit board assembly 23. The flexible circuit board assembly 23 comprises a first flexible circuit board 231, a T-shaped flexible circuit board 232, and a second flexible circuit board 233. The first flexible circuit board 231, the T-shaped flexible circuit board 232, and the second flexible circuit board 233 are formed integrally. An end of a bottom of the T-shaped flexible circuit board 232 is disposed securely on the display panel 21. Two ends of a top of the T-shaped flexible circuit board 232 are connected respectively to the first flexible circuit board 231 and the second flexible circuit board 233 perpendicularly. The first flexible circuit board 231 and the second flexible circuit board 233 are located respectively on two sides of the display panel 21 and are disposed securely on the touch panel 22.

Specifically, the touch panel 22 is a plug-in touch panel, and can be used in electronic apparatuses such as cellular phones, tablet computers, etc. A plurality of touch sensors (not shown in the figures) are disposed on the touch panel 22.

Specifically, receiving pads configured to receive touch signals are disposed in the display panel 21. Furthermore, after the touch panel 22 is bonded to the display panel 21, interface pads of the touch panel are connected electrically to the receiving pads of the display panel 21. Preferably, the interface pads are connected to the receiving pads through an anisotropic conductive adhesive film (ACF).

Figure 3:
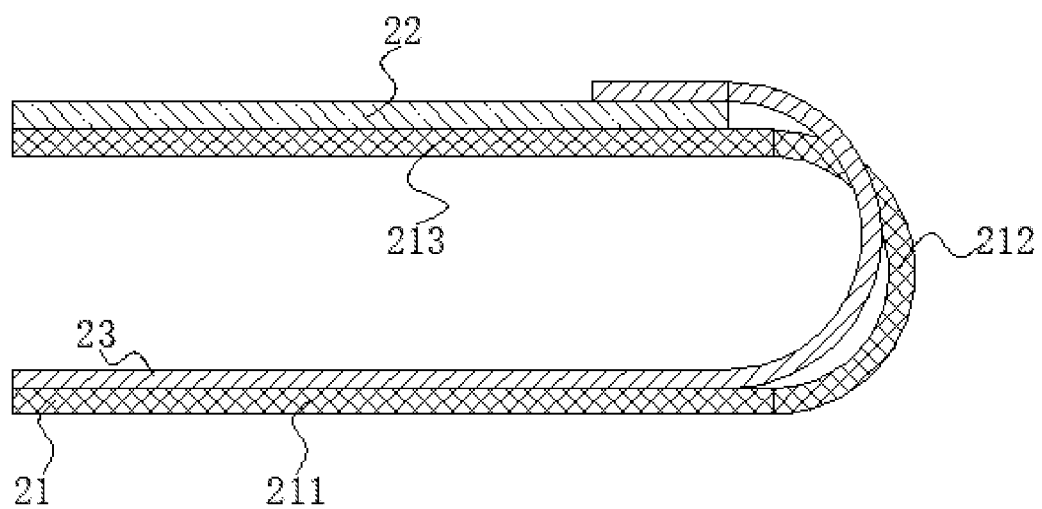
FIG. 3 is a side view of the flexible display device of the present invention after folding.

With reference to 3, FIG. 3 is a side view of the flexible display device of the present invention after folding. The display panel 21 comprises an effective displaying region 211, a folding region 212, and a bonding region 213. The folding region 212 is located between the effective displaying region 211 and the bonding region 213.

Specifically, the touch panel 22 is located in the bonding region 213.

Specifically, the first flexible circuit board 231 and the second flexible circuit board 233 are located respectively two sides of the folding region 212 and are at intervals with the two sides of the folding region 212.

Specifically, the flexible circuit board assembly 23 are disposed securely on the display panel 21 and the touch panel 22 through a conductive adhesive film.

Specifically, the flexible circuit board assembly 23 is designed into a segmented structure such that the flexible circuit board assembly 23 and the folding region 212 are not interfered with each other when folded. Therefore, a folding angle of the flexible circuit board assembly 23 is less than a folding angle of a portion of the display panel 21 in the folding region 212 without caring the issue of abnormal display resulting from the folding region 212 oppressed by the folded flexible circuit board assembly 23.

Advantages of the present invention are as follows. The flexible circuit board assembly and the flexible display device provided by the present invention design the flexible circuit board into a segmented structure such that the folding region of the flexible circuit board is staggered with the folding region of the display pane to prevent damage to the folding region of the display panel during folding of the flexible circuit board and further reduce a size of the lower bezel of the flexible display device.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A flexible circuit board assembly, comprising a first flexible circuit board, a T-shaped flexible circuit board, and a second flexible circuit board, wherein the first flexible circuit board and the second flexible circuit board are located on a top of the T-shaped flexible circuit board and are coplanar with the T-shaped flexible circuit board, two ends of the top of the T-shaped flexible circuit board are connected respectively to the first flexible circuit board and the second flexible circuit board perpendicularly;
  wherein the T-shaped flexible circuit board comprises a first rectangular portion and a second rectangular portion, an end of the first rectangular portion is located under a geometric center of the second rectangular portion and is connected to the second rectangular portion;
  wherein the first flexible circuit board, the T-shaped flexible circuit board, and the second flexible circuit board are formed as an integral structure;
  wherein the first flexible circuit board and the second flexible circuit board are rectangular board-shaped, and are parallel to each other or coaxial, and the first flexible circuit board and the second flexible circuit board are integrally and perpendicularly connected to two ends of the second rectangular portion, respectively.

\* \* \* \* \*